US 6,627,354 B1

(12) United States Patent
Chandross et al.

(10) Patent No.: US 6,627,354 B1
(45) Date of Patent: *Sep. 30, 2003

(54) PHOTORECORDING MEDIUM, PROCESS FOR FABRICATING MEDIUM, AND PROCESS FOR HOLOGRAPHY USING MEDIUM

(75) Inventors: Edwin Arthur Chandross, Murray Hill; Mary Ellen Galvin-Donoghue, Titusville, both of NJ (US); Thomas Xavier Neenan, Boston, MA (US); Sanjay Patel, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/259,973

(22) Filed: Mar. 1, 1999

(51) Int. Cl.[7] .................................................. G03H 1/04
(52) U.S. Cl. .................................. 430/1; 430/2; 359/3
(58) Field of Search ............................... 430/1, 2, 290; 359/1, 3

(56) References Cited

U.S. PATENT DOCUMENTS

| | | | |
|---|---|---|---|
| 3,993,485 A | * 11/1976 | Chandross et al. | 430/290 |
| 4,187,111 A |   2/1980 | Chandross et al. | 430/2 |
| 4,842,968 A |   6/1989 | Kojima et al. | 430/1 |
| 5,081,163 A |   1/1992 | Pekala | 521/187 |
| 5,665,494 A | * 9/1997 | Kawabata et al. | 430/1 |
| 5,698,345 A | * 12/1997 | Ohe et al. | 430/1 |
| 5,719,691 A |   2/1998 | Curtis et al. | 359/11 |
| 5,776,634 A | * 7/1998 | Ohkuma et al. | 430/1 |
| 5,858,614 A | * 1/1999 | Sato et al. | 430/1 |
| 6,077,629 A | * 6/2000 | Parker et al. | 430/1 |

FOREIGN PATENT DOCUMENTS

| | | | |
|---|---|---|---|
| EP | 0945762 | * 9/1999 | |
| JP | 06-148880 | * 5/1994 | 430/1 |
| JP | 07-104641 | * 4/1995 | 430/1 |

OTHER PUBLICATIONS

Glebov, et al., Photorefraction in porous xerogel–photopolymer composite materials, Sov. Tech. Phys. Lett., vol. 16(6), pp 445–446, Jun. 1990.*
Pekala et al. "Aerogels derived from multifunctional organic monomers", J. Non–Crystal. Solids, vol. 145, pp 90–98, 1992.*
D. Psaltis et al., "Holographic Memories," *Scientific American*, (1995).
"Organic Photochemical Refractive Index Image Recording Systems" in *Advances in Photochemistry*, vol. 12, John Wiley & Sons (1980).
V.I. Sukhanov et al., "Sol–Gel Porous Glass as Holographic Medium," Journal of Sol–Gel Science and Technology, vol. 8, 1111 (1997).
S.A. Kuchinskii, "Principles of hologram formation in capillary composites," *Opt. Spectrosc.*, vol. 72, No. 3, 383 (1992).

(List continued on next page.)

*Primary Examiner*—Martin Angebranndt
(74) *Attorney, Agent, or Firm*—Peter V. D. Wilde; Thomas, Kayden, Horstemeyer & Risley LLP

(57) ABSTRACT

A photorecording medium contains a polymeric matrix, typically cross-linked to provide a desired level of physical stability, and a photoimageable system containing a photoactive monomer. Unlike previous polymer media, which tend to contain a substantially homogeneous dispersion of photoimageable system and matrix polymer, the matrix and photoimageable system of the invention are phase separated, yet still exhibit low light scattering such that useful holographic properties are possible.

9 Claims, 2 Drawing Sheets

OTHER PUBLICATIONS

S.A. Kuchinskii, "Principles of Hologram Formation in Capillary Composites," *Laser Physics*, vol. 3, No. 6, 1114 (1993).

V.I. Sukhanov, "Heterogeneous recording media," *Three–Dimensional Holography: Science, Culture, Education*, SPIE vol.1238, 226 (1989).

V.I. Sukhanov, "Porous glass as a storage medium," *Optica Applicata*, vol. XXIV, No. 1–2, 13 (1994).

J.E. Ludman et al., "Very thick holographic nonspatial filtering of laser beams," *Opt. Eng.*, vol. 36, No. 6, 1700 (1997).

M. Kerker, *The Scattering of Light and Other Electromagnetic Radiation*, Academic Press, 1969, 38.

P. Drzaic, *Liquid Crystal Dispersions*, Liquid Crystals, vol. 1, World Scientific (1995).

J. W. Doane, "Polymer Dispersed Liquid Crystal Displays", Liquid Crystals—Applications and Uses, vol. 1, 361–395, World Scientific (1990).

G. Ruben et al., "High Resolution TEM of Organic Aerogels and Inorganic Aerogels," Mat. Res. Soc. Symp. Proc., vol. 180, 785 (1990).

L. Hrubesh et al., Thermal properties of organic and inorganic aerogels, *J. Mater. Res.*, vol. 9, No. 3, 731 (1994).

R. Pekala et al., "A Comparison of Mechanical Properties and Scaling Law Relationships for Silica Aerogels and Their Organic Counterparts," *Mat. Res. Soc. Symp. Proc.*, vol. 207, 197 (1991).

U.S. application No. 09/208,557, filed Dec. 9, 1998.

* cited by examiner

PHOTORECORDING MEDIUM, PROCESS FOR FABRICATING MEDIUM, AND PROCESS FOR HOLOGRAPHY USING MEDIUM

BACKGROUND OF THE INVENTION

1. Field of the Invention

The invention relates to information storage media, in particular storage media useful with holographic systems.

2. Discussion of the Related Art

Developers of information storage devices and methods continue to seek increased storage capacity. As part of this development, so-called page-wise memory systems, in particular holographic systems, have been suggested as alternatives to conventional memory devices. Page-wise systems involve the storage and readout of a representation, e.g., a page, of data. Typically, recording light passes through a two-dimensional array of dark and transparent areas representing data, and the holographic system stores, in three dimensions, holographic representations of the pages as patterns of varying refractive index in a storage medium. Holographic systems are discussed generally in D. Psaltis et al., "Holographic Memories," *Scientific American*, November 1995, the disclosure of which is hereby incorporated by reference. One method of holographic storage is phase correlation multiplex holography, which is described in U.S. Pat. No. 5,719,691 issued Feb. 17, 1998, the disclosure of which is hereby incorporated by reference.

FIG. 1 illustrates the basic components of a holographic system 10. System 10 contains a modulating device 12, a photorecording medium 14, and a sensor 16. Modulating device 12 is any device capable of optically representing data in two-dimensions. Device 12 is typically a spatial light modulator that is attached to an encoding unit which encodes data onto the modulator. Based on the encoding, device 12 selectively passes or blocks portions of a signal beam 20 passing through device 12. In this manner, beam 20 is encoded with a data image. The image is stored by interfering the encoded signal beam 20 with a reference beam 22 at a location on or within photorecording medium 14. The interference creates an interference pattern (or hologram) that is captured within medium 14 as a pattern of, for example, varying refractive index. It is possible for more than one holographic image to be stored at a single location and/or for holograms to be stored in overlapping positions, by, for example, varying the angle, the wavelength, or the phase of the reference beam 22, depending on the particular reference beam employed. Signal beam 20 typically passes through lens 30 before being intersected with reference beam 22 in the medium 14. It is possible for reference beam 22 to pass through lens 32 before this intersection. Once data is stored in medium 14, it is possible to retrieve the data by intersecting reference beam 22 with medium 14 at the same location and at the same angle, wavelength, or phase (depending on the multiplexing scheme used) at which reference beam 22 was directed during storage of the data. The reconstructed data passes through lens 34 and is detected by sensor 16. Sensor 16 is, for example, a charged coupled device or an active pixel sensor. Sensor 16 typically is attached to a unit that decodes the data.

The capabilities of such holographic storage systems are limited in part by the storage media. Iron-doped lithium niobate has been used as a storage medium for research purposes for many years. However, lithium niobate is expensive, is poor in sensitivity (1 J/cm$^2$), has relatively low index contrast ($\Delta$n of about $10^{-4}$), and exhibits destructive read-out (i.e., images are destroyed upon reading). Alternatives have therefore been sought, particularly in the area of photosensitive polymer films. See, e.g., *Selected Papers on Holographic Recording*, H. J. Bjelkagen, ed., SPIE Press, Vol. MS 130 (1996). The materials described in this set of articles generally contain a photoimageable system containing a liquid monomer material (the photoactive monomer) and a photoinitiator (which promotes the polymerization of the monomer upon exposure to light), where the photoimageable material system is located within an organic polymer host matrix that is substantially inert to the exposure light. During writing of information into the material by exposure to radiation in selected areas, the monomer polymerizes in the exposed regions. Due to the lowering of the monomer concentration caused by induced polymerization, monomer from the dark, unexposed regions of the material diffuses to the exposed regions. The polymerization and resulting concentration gradient create a refractive index change, forming the hologram representing the data. Typically, the system is then fixed by a flood cure exposure, which destroys any remaining photosensitivity in the medium. (For further discussion of the recording mechanism, see "Organic Photochemical Refractive Index Image Recording Systems" in *Advances in Photochemistry*, Vol. 12, John Wiley & Sons (1980).) Most holographic systems of this type are based on photopolymerization of free-radical photoactive monomers such as acrylate esters. See, for example, U.S. patent application Ser. No. 08/698, 142 (our reference Colvin-Harris-Katz-Schilling 1-2-16-10), the disclosure of which is hereby incorporated by reference.

While such photopolymer systems provide useful results, they exhibit changes in dimension due to shrinkage induced by polymerization of the photactive monomers. Dimensional changes are also caused by thermal expansion. (Typical linear coefficient of thermal expansion values for these systems range from about 100 to about 300 ppm/° C.) These dimensional changes, while small, tend to distort the recorded holographic gratings, degrade the fidelity with which data is capable of being recovered, and thereby limit the density of data which the polymer is able to support. Some attempts to overcome these dimensional changes have led to experimentation with porous glass matrices containing a photoimageable system. See, e.g., U.S. Pat. Nos. 4,842, 968 and 4,187,111; V. I. Sukhanov et al., "Sol-Gel Porous Glass as Holographic Medium," *Journal of Sol-Gel Science and Technology*, Vol. 8, 1111 (1997); S. A. Kuchinskii, "Principles of hologram formation in capillary composites," *Opt. Spectrosc.*, Vol. 72, No. 3, 383 (1992); S. A. Kuchinskii, "The Principles of Hologram Formation in Capillary Composites," *Laser Physics*, Vol. 3, No. 6, 1114 (1993); V. I. Sukhanov, "Heterogeneous recording media," *Three-Dimensional Holography: Science, Culture, Education*, SPIE Vol. 1238, 226 (1989); V. I. Sukhanov, "Porous glass as a storage medium," *Optica Applicata*, Vol. XXIV, No. 1–2, 13 (1994); and J. E. Ludman et al., "Very thick holographic nonspatial filtering of laser beams," *Opt. Eng.*, Vol. 36, No. 6, 1700 (1997).

U.S. Pat. No. 4,842,968, for example, discloses a process in which a porous glass matrix is immersed in a photoimageable system, such that the photoimageable system diffuses into the open pores of the matrix. After exposure to light, the unexposed, i.e., non-polymerized, portions of the photoimageable system must be removed from the pores with a solvent. Typically, a different material offering desirable refractive index contrast is then introduced into the emptied pores. It is only after these steps that a readable hologram is formed. (While the initial irradiation step tended to form a latent image in these previous matrix-based media, the latent image could not be read non-destructively by the same wavelength of light used for recordation, i.e., the reference beam could not be used for readout. Thus, no hologram was considered to have been formed. As used herein, the term readable hologram indicates a pattern capable of being non-destructively read by the same wavelength of light used for recordation.)

While glass matrices offer desirable rigidity and structural integrity, as well as formation of relatively thick, e.g., greater than 1 mm, media, the '968 patent illustrates several practical drawbacks encountered in such matrix-based recording media. Specifically, complex chemical treatments with solvents are required after exposure to remove reacted or unreacted material in order to attain a readable hologram. These treatments are undesirable from a commercial usability standpoint, and also tend to cause unwanted non-uniformity in the material.

Thus, while progress has been made in fabricating photorecording media suitable for holography, further progress is needed. In particular, media that exhibit improved chemical and structural integrity, yet which are capable of being formed by relatively simple processes, are desired.

SUMMARY OF THE INVENTION

The photorecording medium of the invention offers desirable structural stability, and is capable of being formed by processes less complicated than previous media. Specifically, the medium is fabricated by a relatively straightforward process of mixing the photoimageable system and a polymeric matrix precursor, and curing the precursor in situ. (In situ indicates that the matrix is cured in the presence of the photoimageable system. The matrix is considered to be formed when the photorecording material (i.e., the matrix, photoimageable system, and any other additives) exhibits an elastic modulus of at least about $10^6$ Pa. Curing indicates reacting the matrix precursor such that the matrix provides at least this elastic modulus.) The matrix and photoimageable system are selected to exhibit particular properties relative to each other. First, the photoactive monomer of the photoimageable system and the matrix precursor polymerize by independent reactions, such that the curing step does not interfere with or inhibit hologram formation. Second, the matrix polymer and the photoimageable system are selected such that (a) the matrix precursor and photoimageable system are substantially soluble, i.e. miscible, but (b) during the cure, as the matrix precursor polymerizes, the resulting polymer and the photoimageable system phase separate. (Phase separated indicates that there exist distinct regions predominantly containing the photoimageable system, where at least 75 vol. % of the originally added photoimageable system is found in such regions, and interfacial regions between these distinct regions and the matrix polymer containing varying amounts of matrix material and photoimageable system.) Yet, in spite of this phase separation, the matrix/photoimageable system exhibits low light scattering, such that holographic writing and reading is possible.

(Independent reactions indicate: (a) the reactions proceed by different types of reaction intermediates, e.g., ionic vs. free radical, (b) neither the intermediate nor the conditions by which the matrix is polymerized will induce substantial polymerization of the photoactive monomer (substantial polymerization indicates polymerization of more than 20% of the monomer), and (c) neither the intermediate nor the conditions by which the matrix is polymerized will induce a non-polymerization reaction of the monomer that either causes cross-reaction between monomer and the matrix or inhibits later polymerization of the monomer. The photoinitiator also substantially survives the matrix formation process. Low light scattering indicates that the Rayleigh ratio in 90° light scattering of a wavelength used for hologram formation ($R_{90°}$) is less than about $7\times10^{-3}$. The Rayleigh ratio ($R_\theta$) is a conventionally known property, and is defined as the energy scattered by a unit volume in the direction $\theta$, per steradian, when a medium is illuminated with a unit intensity of unpolarized light, as discussed in M. Kerker, *The Scattering of Light and Other Electromagnetic Radiation*, Academic Press, 1969, 38. The Rayleigh ratio is typically obtained by comparison to the energy scattered by a reference material having a known Rayleigh ratio.)

Thus, unlike previous polymer media, which tend to contain a substantially homogeneous dispersion of matrix polymer and photoimageable system, the medium of the invention contains a matrix and photoimageable system which are phase separated, yet still exhibit low light scattering. Selection to obtain this phase separation is based on relative properties of the matrix and photoimageable system, e.g., solubility and kinetics, as discussed, for example, in the art of aerogels and polymer-dispersed liquid crystals. In addition, parameters such as refractive index contrast and the wavelength being used affect the Rayleigh ratio. The medium is useful for holography, and, advantageously, the matrix is rigid enough to reduce the extent of bulk shrinkage due to image formation, as exhibited by previous polymer-based media. A strength of at least $10^6$ Pa, as measured by shear rheology, is particularly desirable, this measure used as a crude predictor of deleterious optical change upon writing. It has been found that a cross-linked melamine-formaldehyde resin matrix with a photoactive monomer of N,N-dimethylacrylamide offers useful rigidity, phase separation, and holographic properties.

DETAILED DESCRIPTION OF THE INVENTION

Figure 1:
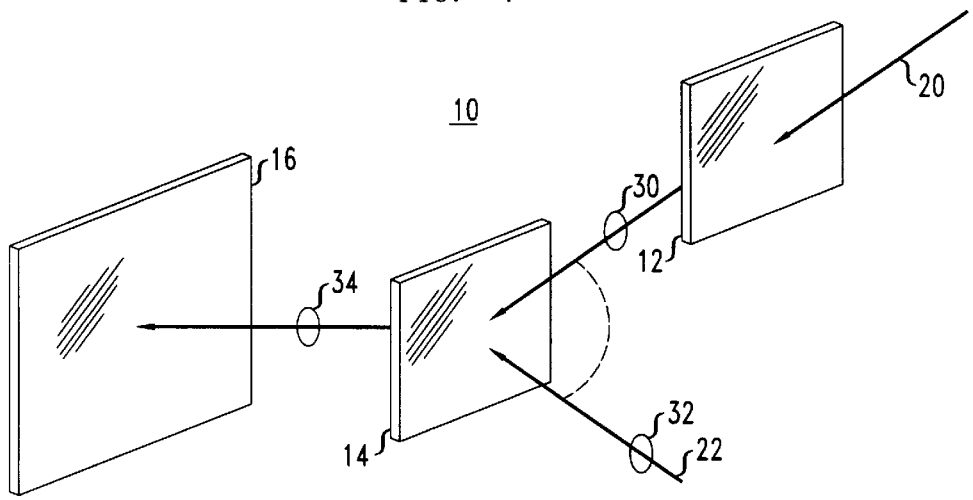
FIG. 1 shows the basic features of a holographic system.

The medium of the invention is fabricated by mixing the photoimageable system and a polymeric matrix precursor, and curing the precursor in situ. The photoactive monomer of the photoimageable system and the matrix precursor are selected such that they polymerize by independent reactions, so the matrix curing step does not interfere with or inhibit hologram formation. The matrix polymer and the photoimageable system components are also selected such that (a) the matrix precursor and photoimageable system are substantially soluble, i.e. miscible, but (b) during the cure, as the matrix precursor polymerizes, the resulting polymer and photoimageable system phase separate. The process is designed, and materials selected, to provide low light scattering, such that useful holography is possible. Refractive index contrast between the matrix and photoimageable system, to improve holographic properties, is also a consideration in selecting the materials, as is the affect of refractive index contrast ($\Delta n$) and wavelength on Rayleigh ratio.

The matrix is a solid polymer formed in situ from a matrix precursor by a curing step. As discussed previously, the matrix is considered to be formed when the photorecording material, i.e., the matrix material plus the photoactive monomer, photoinitiator, and/or other additives, exhibits an elastic modulus of at least about $10^6$ Pa. Generally, the photorecording material will exhibit an elastic modulus of about $10^6$ Pa to about $10^9$ Pa, advantageously at least $10^7$ Pa, as measured by shear rheology. It is possible for the precursor to be one or more monomers, one or more oligomers, or a mixture of monomer and oligomer. In addition, it is possible for there to be greater than one type of precursor functional group, either on a single precursor molecule or in a group of precursor molecules. (Precursor functional groups are the group or groups on a precursor molecule that are the reaction sites for polymerization during matrix cure.) It is advantageous for the matrix to exhibit a three-dimensional cross-linked structure, as opposed to a linear structure, to provide desirable strength. Specifically, a cross-linked structure is better able to resist the bulk shrinkage typically exhibited by polymer-based media during holographic recording.

Examples of polymerization reactions contemplated for forming matrix polymers in the invention include cationic epoxy polymerization, cationic vinyl ether polymerization, epoxy-amine step polymerization, epoxy-mercaptan step polymerization, unsaturated ester-mercaptan step polymerization (via Michael addition), vinyl-silicon hydride step polymerization (hydrosilylation), isocyanate-hydroxyl step polymerization (urethane formation), and isocyanate-amine step polymerization (urea formation). Several such reactions are enabled or accelerated by suitable catalysts.

The photoactive monomer is any monomer or monomers capable of undergoing photoinitiated polymerization, and which, in combination with a matrix material, meets the independent reaction and phase-separation requirements of the invention. Suitable photoactive monomers include those which polymerize by a free-radical reaction, e.g., molecules containing ethylenic unsaturation such as acrylates, methacrylates, acrylamides, methacrylamides, styrene, substituted styrenes, vinyl naphthalene, substituted vinyl naphthalenes, and other vinyl derivatives. Free-radical copolymerizable pair systems such as vinyl ether mixed with maleate are also suitable. It is also possible to use cationically polymerizable systems such as vinyl ethers and epoxies. It is also possible for a single photoactive monomer molecule to contain more than one functional group.

In addition to the photoactive monomer, the medium typically contains a photoinitiator (the photoinitiator and photoactive monomer being part of the overall photoimageable system). The photoinitiator offers a source of species that initiate polymerization of the particular photoactive monomer. Typically, 0.1 to 5 wt. % photoinitiator, based on the weight of the photoimageable system, provides desirable results. A variety of photoinitiators known to those skilled in the art and available commercially are suitable for use in the invention. It is advantageous to use a photoinitiator that is sensitive to light in the visible part of the spectrum, particularly at wavelengths available from conventional laser sources, e.g., the blue and green lines of $Ar^+$ (458, 488, 514 nm) and He—Cd lasers (442 nm), the green line of frequency doubled YAG lasers (532 nm), and the red lines of He—Ne (633 nm) and $Kr^+$ lasers (647 and 676 nm).

It is also possible to use other additives in the photoimageable system, e.g., inert diffusing agents having relatively high or low refractive indices to improve refractive index contrast. Of particular use is a counter-diffusant—a compatible material that diffuses counter to the direction of exposure-induced migration of monomer. Counter-diffusants are useful in further enhancing refractive index contrast between exposed and non-exposed regions.

To be independent, the polymerization reactions for the matrix precursor and the photoactive monomer are selected such that: (a) the reactions proceed by different types of reaction intermediates, (b) neither the intermediate nor the conditions by which the matrix is polymerized will induce substantial polymerization of the photoactive monomer, and (c) neither the intermediate nor the conditions by which the matrix is polymerized will induce a non-polymerization reaction of the monomer that causes cross-reaction (between the monomer and the matrix polymer) or inhibits later polymerization of the monomer. According to item (a), if a matrix is polymerized by use of an ionic intermediate, it would be suitable to polymerize the photoactive monomer by use of a free radical reaction. In accordance with item (b), however, the ionic intermediate should not induce substantial polymerization of the photoactive monomer. Two otherwise independent reactions are not independent for purposes of the invention if both are driven by a single reaction condition. In accordance with item (c), for example, base-catalyzed matrix polymerization should not be performed when the photoactive monomer undergoes a non-polymerization reaction in response to the base, even if polymerization of the monomer is performed by an independent reaction. In addition, the photoinitiator should substantially survive matrix formation.

To provide the phase separation properties, the photoimageable system components and the matrix precursor (and resultant polymer) are selected based on the relative properties of the matrix and photoimageable system. Guidelines known to those in the art are reflected, for example, in the literature of polymer-dispersed liquid crystals (PDLC) and aerogels. For PDLC discussions, see P. Drzaic, *Liquid Crystal Dispersions*, in Series on Liquid Crystals, Vol. 1, World Scientific (1995), and J. W. Doane, "Polymer Dispersed Liquid Crystal Displays", in *Liquid Crystals—Applications and Uses*, Vol. 1, 361–395, World Scientific (1990), the disclosures of which are hereby incorporated by reference. The considerations for achieving a distribution of liquid crystals in a polymeric matrix by phase separation of the polymer are essentially the same considerations for obtaining the distinct regions of photoimageable system in a polymer matrix according to the invention. Phase separation induced by polymerization of an oligomer in situ is discussed in Drzaic, supra, at pages 31–47 and 75–92, this latter section also discussing the relevant kinetic considerations, and in Doane, supra, at page 364. As reflected in the references, the final size of the distinct regions of photoimageable system will depend on a number of factors, including rate of formation of the regions, the growth of the domains by diffusion, and the mechanism by which the polymer matrix locks in the overall structure. For example, fast polymerization will tend to induce smaller regions, due to quick formation of the regions and fast increase in viscosity of the matrix phase. In addition, Doane notes the effects of phase separation on light scatter and refractive index contrast, at pages 378–383.

Organic aerogels are discussed, for example, in U.S. Pat. No. 5,081,163 to Pekala; G. Ruben and R. Pekala, "High Resolution TEM of Organic Aerogels and Inorganic Aerogels," *Mat. Res. Soc. Symp. Proc.*, Vol. 180, 785 (1990); L. Hrubesh and R. Pekala, "Thermal properties of organic and inorganic aerogels," *J. Mater. Res.*, Vol. 9, No. 3, 731 (1994); and R. Pekala et al., "A Comparison of Mechanical Properties and Scaling Law Relationships for Silica Aerogels and Their Organic Counterparts," *Mat. Res. Soc. Symp. Proc.*, Vol. 207, 197 (1991), the disclosures of which are hereby incorporated by reference. Such organic aerogels are useful as the polymeric matrix of the medium of the invention, and lend themselves to phase separation due to their ability to form a porous matrix structure. As discussed, for example, at Col. 6, lines 41–59, of U.S. Pat. No. 5,081,163, fabrication of an aerogel involves formation of a matrix containing solvent-filled pores, followed by removal of the solvent to obtain the air-filled pores characteristic of an aerogel. In the invention, however it is desired to retain in such pores a photoimageable system. The standard methods of aerogel fabrication, with the phase separation guidelines found in the art of PDLC, are useful in providing such a structure. Formation of such an organic aerogel matrix that contains regions of photoimageable system is reflected in the examples below. By providing a photoactive monomer that polymerizes by a mechanism independent from the matrix precursor, by and selecting the matrix precursor and photoimageable system to phase separate upon matrix polymerization, interference with the formation process of an aerogel's matrix structure is reduced. The desired structure for a holographic medium (i.e., distinct regions of photoimageable system) is thereby obtained.

In addition to the kinetic considerations, variables such as concentrations, molecular weight, and curing conditions also have a significant affect on phase separation, and such variables are therefore adjusted to provide a desired result. Refractive index contrast between the matrix and photoimageable system is also a consideration in selecting the materials, to improve the holographic properties of the medium. Also, refractive index contrast and the particular wavelength being used affect the Rayleigh ratio.

The resulting medium contains a polymeric matrix and a photoimageable system, the matrix and the photoimageable system phase separated, such that distinct regions predominantly containing the photoimageable system are present and such that the Rayleigh ratio in 90° light scattering of a wavelength used for hologram formation ($R_{90°}$) is less than about $7 \times 10^{-3}$, as discussed previously. (This Rayleigh ratio is found both before hologram formation (after matrix cure) and after hologram formation in the medium.) Generally, distinct regions of photoimageable system having a maximum dimension of about 50 nm or less are suitable for attaining this low light scattering. Advantageously, at least a portion of the distinct regions of photoimageable system are connected to at least one other region, this interconnectivity allowing photoactive monomer to diffuse more readily from one region to another during hologram formation. It was observed that the speed of the flood cure suggested little monomer in the matrix and facile diffusion between regions. The size of the regions, the interconnectivity of the regions, and the particular level of light scattering are secondary, however, to achieving useful holographic properties. The region size and interconnectivity, and the light scatter, will therefore tend to vary based on the particular components of the matrix and the photoimageable system.

It has been found that a cross-linked melamine-formaldehyde resin matrix, which readily forms organic aerogels (as discussed in the references cited above), with N,N-dimethylacrylamide as a photoactive monomer and a counter-diffusant of phenylnaphthalene offers desirable rigidity, phase separation, and holographic properties, as reflected in the examples below.

The invention will be further clarified by the following examples, which are intended to be exemplary.

EXAMPLE 1

A photorecording material was made by the following process. A photoimageable system was formed by mixing 0.34 ml of N,N-dimethylacrylamide monomer (the photoactive monomer), 0.10 ml phenylnaphthalene (diffusing agent), and 0.083 g of a photoinitiator—bis(cyclopentadienyl)bis[2,6-difluoro-3(1-H-pyrrol-1-yl)phenyl]titanium (Ciba-Geigy C67845). (These amounts provided about 10 wt. % monomer and about 7 wt. % phenylnaphthalene.) To the photoimageable system was added 2.5 ml of poly(melamine-co-formaldehyde) methylated resin (obtained from Aldrich Chemical Company). Subsequently, 0.125 ml of concentrated hydrochloric acid was added to initiate cure of the resin, and the mixture was placed into 7.5 mm zirconia NMR (nuclear magnetic resonance) rotors with Teflon plugs sealed with Krazy® glue, the plugs preventing loss of volatile products during cure. The material was cured overnight (about 18 hours) at 58° C.

Solid state NMR testing was performed to characterize the structure of the cured material. The testing indicated that the cured material had phase separated, containing distinct regions of predominantly N,N-dimethylacrylamide monomer with dimensions of 9.6 nm, with 20.7 nm between regions.

EXAMPLE 2

The holographic properties of a medium formed according to the invention were measured. Material was made according to Example 1, but upon addition of the hydrochloric acid, the mixture was placed between two glass plates using a gasket to retain the liquid. The cure was performed as in Example 1. After the cure, the thickness of the material was about 0.5 mm.

Holographic recording was performed by known methods discussed previously. A reference beam and a signal beam for holographic recording were provided by a coherent pumped YAG laser, producing light at a wavelength of 532 nm. The two beams were directed at the medium such that a ray normal to the surface of the medium bisected the beams. The ½ angle between the beams was varied to change the d-spacing of the grating (according to the well-known relationship $d=\lambda/\{(n)(2 \sin(\theta))\}$). The resulting interference patterns had a grating visibility of 0.9. (Grating visibility is known in the art, and is defined as the value of:

$$\frac{2E_0 E_1}{E_0^2 + E_1^2},$$

where $E_0$ and $E_1$ represent the amplitudes of the field for each of the two beams, respectively.)

Figure 2:
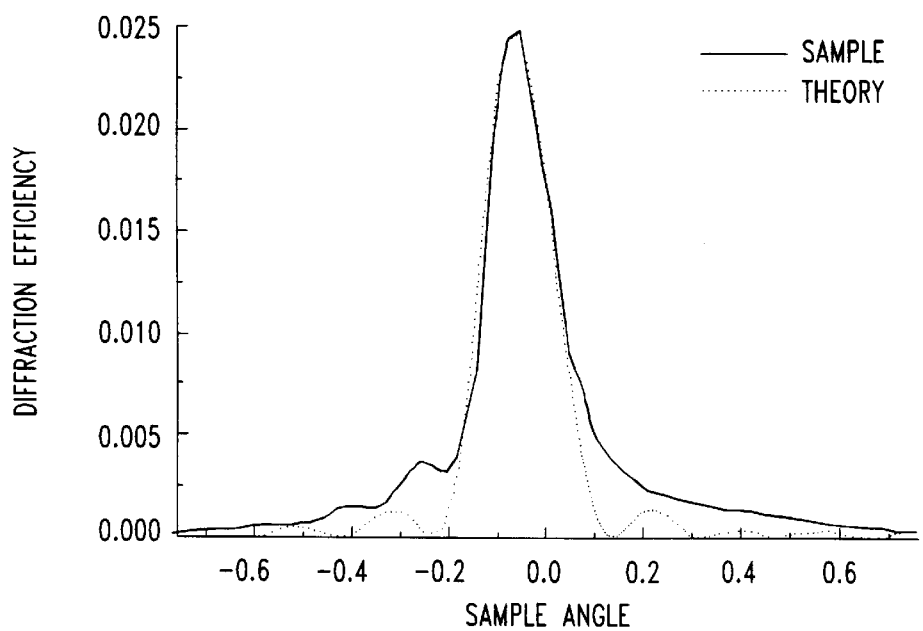
FIG. 2 shows the diffraction efficiency of a medium of the invention.
Figure 3:
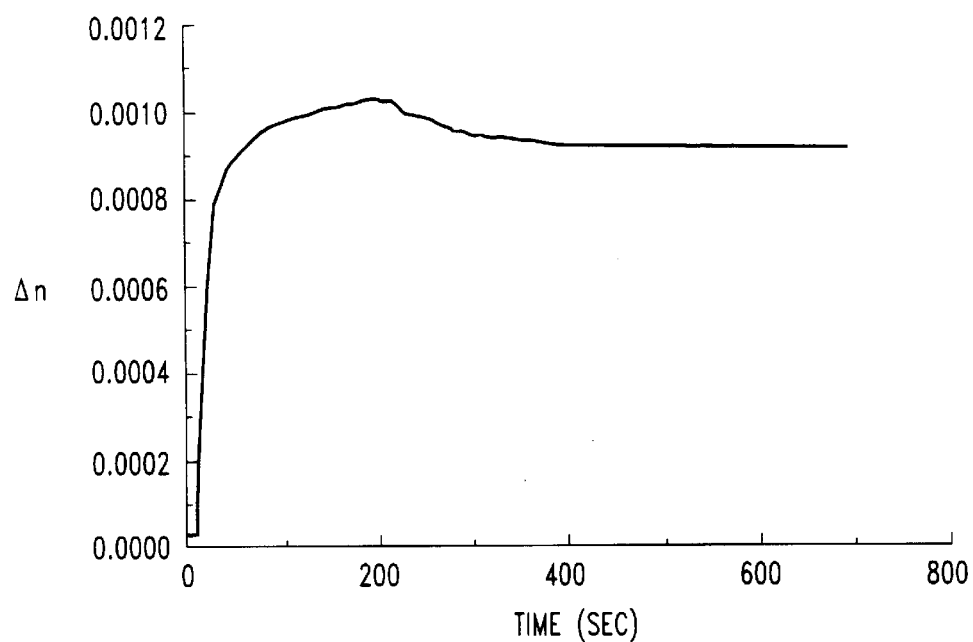
FIG. 3 shows real-time monitoring of refractive index contrast in a medium of the invention.

A 1 mW HeNe laser (at 632 nm) provided real time monitoring of the initial stages of grating formation without inducing photoreactions in the medium. The extent of diffraction measure by the HeNe probe beam was qualitatively proportional to hologram strength, but was not a quantitatively accurate measure. The angle dependence of the holograms was measured by incrementally stepping the medium angle using a Klinger rotation stage (having 0.002 degree resolution), and monitoring the diffracted light from the sample using silicon diode detectors. Final diffraction efficiencies were calculated from the maximum diffraction measured for the reference beam, and are reflected in FIG. 2. FIG. 3 shows the refractive index contrast from real time monitoring performed during writing. (The diffraction efficiency was converted to the corresponding Δn using known methods.)

Figure 4:
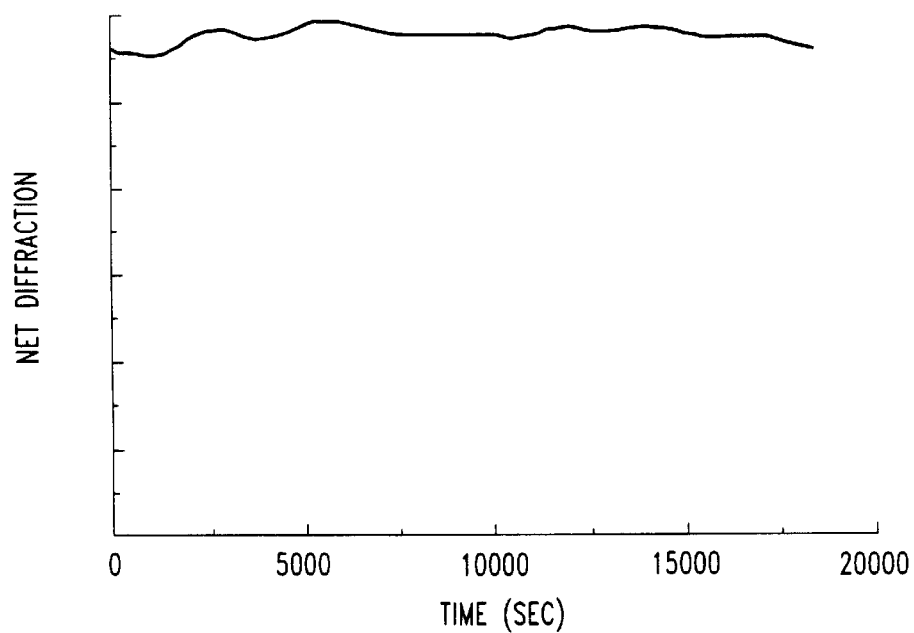
FIG. 4 shows the stability of a hologram written into a medium of the invention.

In addition, an overnight flood illumination was performed with a Xenon lamp filtered to provide 10 mW/cm² in the visible light spectrum on a sample. FIG. 4 shows that the grating was only marginally affected by the overnight illumination.

Other embodiments of the invention will be apparent to those skilled in the art from consideration of the specification and practice of the invention disclosed herein.

What is claimed is:

1. A process for fabricating a photorecording medium, comprising the steps of:

providing a mixture comprising an organic polymeric matrix precursor and a photoimigeable system that comprises a photoactive monomer; and thermally curing the polymeric matrix precursor in situ to form an organic, three dimensional, cross-linked polymeric matrix having an elastic modulus of at least $10^7$ Pa with the photoimigeable system disposed therein, wherein, during the thermal curing step, the matrix and the photoimigeable system phase separate, and wherein the matrix and photoimageable system exhibit a Rayleigh ratio, in 90° light scattering of a wavelength useful for hologram formation, less than about $7 \times 10^{-3}$.

2. The process of claim 1, wherein the photoimageable system further comprises a photoinitiator.

3. The process of claim 1, wherein the photoimageable system further comprises a counter-diffusant.

4. The process of claim 1, wherein the polymeric matrix comprises a melamine-formaldehyde resin.

5. The process of claim 4, wherein the photoimageable system comprises N,N-dimethylacrylamide monomer.

6. The process of claim 5, wherein the photoimageable system further comprises a counter-diffusant of phenylnaphthalene.

7. The process of claim 4, wherein the cure is performed by addition of acid to the mixture.

8. The process of claim 7, wherein the acid is hydrochloric acid.

9. The process of claim 1, wherein the organic polymeric matrix comprises an organic aerogel.

* * * * *